US008445180B2

(12) United States Patent
Onoda et al.

(10) Patent No.: US 8,445,180 B2
(45) Date of Patent: May 21, 2013

(54) WATER-DEVELOPABLE PHOTOPOLYMER PLATE FOR LETTERPRESS PRINTING

(75) Inventors: Naoyuki Onoda, Fuji (JP); Katsuhiro Takahashi, Fuji (JP)

(73) Assignee: Asahi Kasei Chemicals Corporation, Tokyo (JP)

(*) Notice: Subject to any disclaimer, the term of this patent is extended or adjusted under 35 U.S.C. 154(b) by 658 days.

(21) Appl. No.: 10/584,628

(22) PCT Filed: Dec. 21, 2004

(86) PCT No.: PCT/JP2004/019115
§ 371 (c)(1),
(2), (4) Date: Jun. 26, 2006

(87) PCT Pub. No.: WO2005/064413
PCT Pub. Date: Jul. 14, 2005

(65) Prior Publication Data
US 2007/0160933 A1    Jul. 12, 2007

(30) Foreign Application Priority Data

Dec. 26, 2003 (JP) ................................. 2003-433220
Jan. 6, 2004 (JP) ................................. 2004-001318

(51) Int. Cl.
*G03F 7/00* (2006.01)
*G03F 7/26* (2006.01)
*G03C 5/26* (2006.01)

(52) U.S. Cl.
USPC ........................................ 430/306; 430/434

(58) Field of Classification Search
USPC ............. 430/273.1, 302, 300, 306, 309, 422, 430/423, 434
See application file for complete search history.

(56) References Cited

U.S. PATENT DOCUMENTS

| 4,603,058 | A |   | 7/1986 | Adams |   |
|---|---|---|---|---|---|
| 4,806,506 | A |   | 2/1989 | Gibson, Jr. |   |
| 4,876,118 | A | * | 10/1989 | Wallbillich | 427/142 |
| 5,532,116 | A | * | 7/1996 | Suzuki et al. | 430/331 |
| 5,719,009 | A | * | 2/1998 | Fan | 430/306 |
| 5,856,066 | A | * | 1/1999 | Yoshida et al. | 430/309 |
| 6,403,284 | B1 | * | 6/2002 | Yoshida | 430/309 |
| 2002/0034706 | A1 | * | 3/2002 | Haraguchi et al. | 430/273.1 |
| 2002/0182543 | A1 | * | 12/2002 | Fujii | 430/302 |
| 2006/0144272 | A1 | * | 7/2006 | Haraguchi et al. | 101/463.1 |

FOREIGN PATENT DOCUMENTS

| EP | 0539227 A1 | * | 10/1992 |
|---|---|---|---|
| EP | 0 791 859 A2 |  | 8/1997 |
| EP | 1 258 349 A1 |  | 11/2002 |
| JP | 46-35162 B |  | 10/1971 |
| JP | 51-40206 |  | 4/1976 |
| JP | 51047805 A |  | 4/1976 |
| JP | 52-13904 |  | 2/1977 |
| JP | 53143669 A |  | 12/1978 |
| JP | 55135838 A |  | 10/1980 |
| JP | 58-33884 |  | 7/1983 |
| JP | 59138454 A |  | 8/1984 |
| JP | 60-191238 |  | 9/1985 |
| JP | 61-47966 |  | 3/1986 |
| JP | 62-500404 |  | 2/1987 |
| JP | 63-88555 |  | 4/1988 |
| JP | 1121858 A |  | 5/1989 |
| JP | 05-134410 |  | 5/1993 |
| JP | 5132557 A |  | 5/1993 |
| JP | 42 11 934 A1 |  | 10/1993 |
| JP | 06-186740 |  | 7/1994 |
| JP | 06-282082 |  | 10/1994 |
| JP | 9236910 A |  | 9/1997 |
| JP | 10-78657 |  | 3/1998 |
| JP | 10-90892 |  | 4/1998 |
| JP | 10-171111 |  | 6/1998 |
| JP | 2940006 |  | 6/1999 |
| JP | 11152440 A |  | 6/1999 |
| JP | 2985655 |  | 10/1999 |
| JP | 2000345474 A |  | 12/2000 |
| JP | 2002-292985 |  | 10/2002 |
| JP | 2002-292985 A1 | * | 10/2002 |
| JP | 2002 365 814 |  | 12/2002 |
| JP | 2003 114 537 |  | 4/2003 |
| JP | 2003-107681 |  | 4/2003 |
| JP | 2003221542 A |  | 8/2003 |
| JP | 3508788 |  | 1/2004 |
| JP | 2005084418 A |  | 3/2005 |
| JP | 2008143187 A |  | 6/2008 |
| WO | WO 86/02177 A1 |  | 4/1986 |
| WO | WO 2004074942 A1 | * | 9/2004 |

OTHER PUBLICATIONS

Anti-foam (SH-4) safety data sheet (2011).*
www.britannica.com/Polymer (2011).*
Polydimethylsiloxane data sheet (anti-foam; 2011).*
Office Action for Japanese Application No. 2005-516594 dated Jun. 2, 2009 (4 pages).

(Continued)

*Primary Examiner* — Cynthia Kelly
*Assistant Examiner* — Chanceity Robinson
(74) *Attorney, Agent, or Firm* — Finnegan, Henderson, Farabow, Garrett & Dunner, L.L.P.

(57) ABSTRACT

Disclosed is a method for producing a water-developable photopolymer plate for letterpress printing comprising an exposure step, a development step and a post-exposure step wherein the photopolymer plate is brought into contact with a liquid containing a modified silicone compound and/or a fluorine compound during or after the exposure step.

9 Claims, No Drawings

OTHER PUBLICATIONS

Office Action for Japanese Application No. 2005-516594 dated Aug. 31, 2009 (3 pages).

Information Offering for Japanese Application No. 2005-516594 dated Dec. 2, 2009 (5 pages).

European Search Report for Application No. EP 04807472.8 dated Feb. 10, 2010.

EP Office Action for Counterpart Application No. EP 04 807 472.8-1226 dated Dec. 12, 2011.

* cited by examiner

WATER-DEVELOPABLE PHOTOPOLYMER PLATE FOR LETTERPRESS PRINTING

TECHNICAL FIELD

The present invention relates to a water-developable photopolymer plate for letterpress printing and a method for producing the same.

BACKGROUND ART

A commonly used photopolymer plate for letterpress printing is produced, for example, as described in Patent Documents 1 to 3, through an exposure step, a development step and a post-exposure step.

A printing method using a photopolymer plate for flexographic printing is a method in which an ink is supplied by using an ink supply roll or the like onto the surface of the raised areas of a polymer plate having raised and recessed areas and then, the polymer plate is brought into contact with a printing substrate so that the ink on the surface of the raised areas can be transferred onto the printing substrate. In such a flexographic printing, frequently in long-term printing, the ink sticks to the shoulders of the raised areas of the photopolymer plate, or gets into the recessed areas in the polymer plate (hereinafter, referred to as plate surface staining). Consequently, the portions other than the true images are sometimes printed erroneously. In such cases, it is necessary that printing is once halted, and the surface of the polymer plate is wiped away with a strip of cloth by using a washing liquid such as alcohol, which is economically disadvantageous.

On the other hand, the development of conventional photopolymer plates for letterpress printing generally adopts methods using organic solvents; however, from the viewpoint of environmental protection, plates permitting the use of aqueous developers are actively being developed. Techniques using such aqueous developers are proposed, for example, in Patent Documents 4 to 7 and the like. In water-developable photopolymer plates, there are used highly polar oligomers or monomers for liquid resins in order to impart water developability thereto. For solid resins, generally adopted is a technique in which a polar group-containing polymer is introduced as a polymer to constitute the main composition component, or a technique in which a polar group-containing polymer and a hydrophobic polymer are mixed and dispersed to be used. In particular, the latter method is preferably adopted because it leads to a better plate durability and permits forming a high-definition plate surface.

As a result of such composition characteristics, a water-developable photopolymer plate for letterpress printing is more increased in the polarity of the plate surface as compared to a solvent-developable photopolymer plate containing as the main component a hydrophobic polymer such as a thermoplastic elastomer, and hence is excessively increased in the affinity to the ink. Consequently, such an aforementioned phenomenon that the ink sticks to the shoulders of the raised areas, or gets into the raised areas in the polymer plate tends to occur more frequently.

In these years, the application of the letterpress printing to the high-definition printing has been promoted, and printing is made using halftone dots in order to develop the gradation in color and density. In such printing, excessive ink causes the ink fill-in around the relief of fine halftone dots used in a halftone printing with a large number of halftone lines, namely, the bridging between dots. Consequently, it causes marked degradation of printing quality to practically inhibiting the use of such halftone printing. Printing on plastic films has actively been carried out by using the letterpress printing. However, when printing substrates altered from the paper substrates to plastic film substrates low in ink absorbability, a conventional water-developable photopolymer plate for letterpress printing suffers from the following drawback: poor ink transferability results exclusively in low-density solid quality and in blurred printing; and attempt to compensate the poor ink transferability by increasing the printing pressure results in a slight increase in the solid printed portion density but, in return for it, in significant defects such as thick lines and dots, to inhibit a well-balanced printing.

Thus, conventional water-developable photopolymer plates for letterpress printing are limited in printable patterns and printing substrates because of the properties thereof in relation to the ink. Consequently, as affairs now stand, water-developable photopolymer plates for letterpress printing are limited in use in spite of the adaptability thereof to the environment.

Thus, as for the plate surface staining of a polymer plate, various methods have been proposed.

Patent Document 8 describes a technique in which an organic fluorine compound is adhered onto the surface of a plate by brush coating or spraying. However, this is effective only in halftone dot printing with a low number of lines and is insufficient in sustained effects, thus manifesting itself to be a method far away from solving the above described problems.

Patent Document 9 describes a method in which a material selected from a silane coupling agent, a silicone oil and a silicone grease is internally added in a photopolymer, and then such a material is made to migrate to the surface of the photopolymer. This method is a method aiming at prevention of generation of tear flaws in plate making operation and the like, and a method in which a silicone compound is basically made to bleed. Accordingly, the silicone compound is removed from the surface at the time of printing, so that the sustainability of the hydrophobic effect of the surface due to silicone cannot be expected at all.

Patent Document 10 proposes a method in which a mixture composed of an aqueous emulsion including a silicone compound or a fluorine compound and an aqueous resin is coated. However, the coating of an aqueous solution having a low penetrating ability does not necessarily provide a sufficient effect of preventing the plate surface staining. Such an effect can hardly be sustained particularly in a long run printing or a repeated printing, which necessitates repetition of such a coating in order to maintain the effect.

Patent Document 11 proposes a method in which the contact angle of the surface of the plate is made large by internally adding a hydrophobic compound, containing fluorine, chlorine or silicon, copolymerizable with the polymer material in a water-developable composition. This method is excellent in that such copolymerization with the photopolymer component makes it possible to fix the hydrophobilization of the plate surface to the resin. However, as mentioned in the specification, applicable resins are restricted to liquid or paste-like homogeneous resins such as polyurethane resins, polyvinyl alcohol resins, polyester resins or nylon resins. The present inventors have revealed that unexpected adverse effects may occur when such a technique is applied to a resin system, among water-developable photopolymers, in which a polar group-containing polymer and a hydrophobic polymer are mixed and dispersed, and which provides a plate with durability and allows forming a high-definition plate surface. The adverse effects are such that when a fluorine compound or a silicone compound is being added to the resin system in which a polar group-containing polymer and a hydrophobic polymer are mixed and dispersed, the fluorine compound or the silicone compound results in bleeding from the resin, or the plate becomes turbid to cause light scattering at the time of exposure, and consequently, image formation quality is degraded in such a way that there are caused, for example, failure in formation of fine lines and failure in shape of dots. Such addition of the hydrophobic compound as allowing suppressing to the utmost the degradation of image formation quality makes in turn the hydrophobic effect in the plate surface too small to attain the purpose. The operating mechanism to cause the turbid plate is not clear at present; however, it is inferred that the turbid plate may be ascribable to the light scattering amplified at the interface between the polar group-containing polymer and the hydrophobic polymer in which interface the hydrophobic substance tends to be present in the resin system wherein the polar group-containing polymer and the hydrophobic polymer are mixed and dispersed.

Patent Document 1: JP-A-10-171111
Patent Document 2: JP-A-63-088555
Patent Document 3: JP-A-05-134410
Patent Document 4: Japanese Patent No. 3508788
Patent Document 5: JP-B-58-33884
Patent Document 6: Japanese Patent No. 2940006
Patent Document 7: Japanese Patent No. 2985655
Patent Document 8: JP-A-51-40206
Patent Document 9: JP-A-60-191238
Patent Document 10: JP-A-2002-292985
Patent Document 11: JP-A-6-186740

DISCLOSURE OF THE INVENTION

Problems to be Solved by the Invention

The problem of the present invention is to provide a method for producing a photopolymer plate wherein a water-developable photopolymer plate for letterpress printing is adopted, the photopolymer plate is capable of printing with a satisfactory balance between the high definition and the high density in the solid printed portions without degrading the image formability thereof, the ink blot of the plate surface can be prevented over a long period of time, and the photopolymer plate can be spared, to the highest possible degree, from cumbersome operations such as plate wiping in the printing process.

Means for Solving the Problems

For the purpose of solving the aforementioned problems, the present inventors have made a diligent study. Consequently, the present inventors have completed the present invention by discovering that the problems can be solved by bringing the surface of the polymer plate, during or after an exposure step, into contact with a liquid containing a silicone compound and/or a fluorine compound.

More specifically, the present invention may be described as follows.

(1) A method for producing a water-developable photopolymer plate for letterpress printing comprising an exposure step, a development step and a post-exposure step, wherein the photopolymer plate is brought into contact with a liquid comprising a modified silicone compound and/or a modified fluorine compound during or after the exposure step.
(2) The method according to (1), wherein the photopolymer comprises: a binder polymer comprising a polar group-containing polymer and a hydrophobic polymer; an ethylenically unsaturated compound; and a photopolymerization initiator.
(3) The method according to (1) or (2), wherein the modified silicone compound and/or the modified fluorine compound comprises one or more modifying groups selected from the group consisting of a hydroxy group, a carbinol group, an epoxy group, a (meth)acrylate group, a carboxyl group, a carboxylate group, an amino group, an aromatic hydrocarbon group inclusive of a phenyl group, a hydrocarbon group substituted with an aromatic hydrocarbon inclusive of a methylstyryl group, an aromatic hydrocarbon group substituted with a hydroxy group inclusive of a hydroxyphenyl group, an alkoxyl group, a (poly)ether group and a urethane group.
(4) The method according to any one of (1) to (3), wherein an irradiation with actinic light is carried out after the photopolymer plate has been brought into contact with the liquid comprising the modified silicone compound and/or the modified fluorine compound.
(5) The method according to (4), wherein the photopolymer plate is brought into contact with the liquid comprising the modified silicone compound and/or the modified fluorine compound after the development step and immediately before the post-exposure step.
(6) The method according to (4) or (5), wherein development is carried out by using a developer comprising the modified silicone compound and/or the modified fluorine compound.
(7) The method according to (6), wherein the modified silicone compound is a silicone compound comprising one or more modifying groups selected from the group consisting of a hydroxy group, a carbinol group, an epoxy group, a (meth)acrylate group, a carboxyl group, a carboxylate group, an amino group and a (poly)ether group.
(8) The method according to any one of (1) to (3), wherein the post-exposure step is carried out while the photopolymer plate is being brought into contact with the liquid comprising the modified silicone compound and/or the modified fluorine compound.
(9) The method according to (1), wherein the liquid comprising the modified silicone compound and/or the modified fluorine compound is a developer.
(10) A developer, comprising a modified silicone compound and/or a modified fluorine compound, for use in producing a water-developable photopolymer plate for letterpress printing.
(11) The developer according to (10), comprising: (a) 1 to 50 parts by weight of one or more surfactants; (b) 0.01 to 20 parts by weight of the modified silicone compound; (c) 0.2 to 20 parts by weight of an alkyl glycol ether; and (d) 0.1 to 10 parts by weight of an alkali builder.
(12) The developer according to (10) or (11), wherein the modified silicone compound is a silicone compound comprising one or more modifying groups selected from the group consisting of a hydroxy group, a carbinol group, an epoxy group, a (meth)acrylate group, a carboxyl group, a carboxylate group, an amino group and a (poly)ether group.
(13) A water-developable photopolymer plate for letterpress printing produced by the method according to any one of (1) to (9).
(14) A water-developable photopolymer plate for letterpress printing, comprising silicon on a surface thereof in a relative element concentration of 0.1 at % or more.
(15) The water-developable photopolymer plate for letterpress printing according to (13) or (14), wherein a rate of a change of a diameter of an indicator of surface wettability between before and after a treatment by using a 20/80 (weight ratio) ethyl acetate/isopropyl alcohol mixed solvent is 25% or less.
(16) The water-developable photopolymer plate for letterpress printing according to (13) or (14), comprising silicon on the surface of the polymer in a relative element concentration of 0.1 at % or more after the treatment by using the 20/80 (weight ratio) ethyl acetate/isopropyl alcohol mixed solvent.

Advantages of the Invention

According to the production method of the present invention, there can be provided a water-developable photopolymer plate for letterpress printing wherein the photopolymer plate is capable of printing with a satisfactory balance between the high definition and the high density in the solid printed portions without degrading the image formability thereof, the ink blot of the plate surface can be prevented over a long period of time, and the photopolymer plate can be spared, to the highest possible degree, from cumbersome operations such as plate wiping in the printing process.

BEST MODE FOR CARRYING OUT THE INVENTION

The present invention will be described below in detail, particularly with a focus on the preferred embodiments.

A water-developable photopolymer plate for letterpress printing of the present invention is produced through an exposure step, a development step and a post-exposure step. The resin prior to exposure may be fluid or solid at room temperature, and usually, the plate thickness of a usually used plate falls within a range from 0.5 to 10 mm. There may be used a resin well known in the art as used in a water-developable photopolymer plate. Examples of such a resin may include, for example, those resins proposed in Patent Documents 4, 5, 6 and 7, and the like. A fundamental constitution of such a resin comprises an oligomer or polymer component, a polymerizable monomer component, a photoinitiator and a stabilizer. A variety of materials can be used as the oligomer or polymer component that has the most significant effect on the physical properties of the plate; examples of the cases using such materials include various cases in each of which there is used a polyurethane resin, a polyvinyl alcohol resin, a polyester resin, a nylon resin or a resin (binder polymer) in which a polar group-containing polymer and a hydrophobic polymer are mixed and dispersed. In particular, when there is used a resin in which a polar group-containing polymer and a hydrophobic polymer are mixed and dispersed, the durability and the high definition plate surface formability of the plate are excellent, and such a resin is high in general versatility and useful in printing. Examples of such a resin may include the following.

Examples of a polar group-containing polymer may include water soluble or water dispersible copolymers each of which contains a hydrophilic group such as a carboxyl group, an amino group, a hydroxy group, a phosphoric acid group or a sulfonic acid group, or a salt of such a group. More specifically, examples of a polar group-containing polymer may include: a carboxyl group-containing NBR and a carboxyl group-containing SBR described in Japanese Patent No. 2128098; carboxyl group-containing polymers of aliphatic conjugated dienes described in JP-A-5-7705, JP-A-61-128243, JP-A-6-194837, JP-A-7-134411 and the like; a phosphoric acid group-containing or carboxyl group-containing emulsified polymer of an ethylenically unsaturated compound described in JP-A-9-15860; a sulfonic acid group-containing polyurethane described in JP-A-3-206456; and a carboxyl group-containing butadiene latex described in Japanese Patent Application No. 2000-361371. These hydrophilic polymers may be used each alone or in combinations of two or more thereof.

The hydrophobic polymers to be used in combination with these hydrophilic polymers may be polymers obtained by polymerizing conjugated diene hydrocarbons and copolymers obtained by polymerizing a conjugated diene hydrocarbon and a monoolefin unsaturated compound; examples of such hydrophobic polymers may include: a butadiene polymer, an isoprene polymer, a chloroprene polymer, a styrene-butadiene copolymer, a styrene-butadiene-styrene copolymer, a styrene-isoprene copolymer, a styrene-isoprene-styrene copolymer, a styrene-chloroprene copolymer, an acrylonitrile-butadiene copolymer, an acrylonitrile-isoprene copolymer, a methyl methacrylate-butadiene copolymer, a methyl methacrylate-isoprene copolymer, an acrylonitrile-butadiene-styrene copolymer, and an acrylonitrile-isoprene-styrene copolymer. These hydrophobic polymers may be used each alone or in combinations of two or more thereof.

No particular constraint is imposed on the polymerizable monomers to be used in combinations with these oligomer or polymer components. Examples of such a monomer may include ester compounds between ethylenically unsaturated acids and alcohols, and those compounds described in a reference "Photocuring Technique Data Book (Hikari Kokagijutu Data Book) (published by Technonet Co., Ltd.)" and the like. More specifically, examples of such monomers may include: straight chain, branched and cyclic monofunctional monomers such as hexyl(meth)acrylate, nonane(meth)acrylate, lauryl(meth)acrylate, stearyl(meth)acrylate, 2-ethyl, 2-butylpropanediol(meth)acrylate, hydroxyethyl(meth)acrylate, 2-(meth)acryloyloxyethyl hexahydrophthalate, 2-(meth)acryloyloxyethyl phthalate, (meth)acrylic acid dimer, ECH-modified allyl acrylate, benzyl acrylate, caprolactone(meth)acrylate, dicyclopentenyl(meth)acrylate, isobornyl(meth)acrylate and cyclohexyl(meth)acrylate; and straight chain, branched and cyclic multifunctional monomers such as hexanediol di(meth)acrylate, nonanediol di(meth)acrylate, 2-ethyl, 2-butylpropane di(meth)acrylate, neopentylglycol di(meth)acrylate, neopentylglycol hydroxypivalate di(meth)acrylate, ECH-modified phthalic acid di(meth)acrylate, tricyclodecane di(meth)acrylate, trimethylolpropane tri(meth)acrylate, pentaerythritol tri(meth)acrylate, ECH-modified glycerol tri(meth)acrylate, trimethylolpropane benzoate(meth)acrylate, EO(PO)-modified trimethylolpropane tri(meth)acrylate and dipentaerythritol hexa(meth)acrylate. Alternatively, examples of such monomers may include esters between alcohols and fumaric acid such as dioctyl fumarate, and N-substituted maleimide derivatives such as laurylmaleimide and cyclohexylmaleimide.

Examples of the photopolymerization initiator used as one of the other components may include those described in references, "Photocuring Technique Data Book (Hikari Kokagijutu Deta Bukku) (published by Technonet Co., Ltd.), "Ultraviolet Curing System (Shigaisen Koka Shisutemu) (published by Sogo Gijutsu Center) and the like. More specifically, examples of the photopolymerization initiator may include benzophenone, Michler's ketone, benzoin, benzoin methyl ether, benzoin ethyl ether, α-methylolbenzoin, α-methylolbenzoin methyl ether, benzyl methyl ketal, 1-hydroxycyclohexyl-phenyl ketone, benzophenone, acrylated benzophenone, methyl o-benzoylbenzoate, bisacyl phosphine oxide, α-methoxybenzoin methyl ether, 2,2-dimethoxy-2-phenylacetophenone, 2,2-diethoxy-2-phenylacetophenone, 2-methyl-1-(4-methylthio)phenyl, 2-morpholinopropan-1-one, thioxanthone, benzil and anthraquinone. These may be used each alone or in combinations of two or more thereof.

Additionally, there may be blended, if needed, additives such as a polymerization inhibitor, a plasticizer, a dye, an ultraviolet absorber and an antioxonant. Examples of the plasticizer may include liquid 1,2(or 1,4)-polybutadiene, 1,2 (or 1,4)-polyisoprene, and terminal modified products of these compounds; and hydrocarbon oils such as naphthene oil and paraffin oils. Examples of the polymerization inhibitor may include phenols such as hydroquinone, p-methoxyphenol, 2,4-di-t-butylcresol, catechol and t-butylcatechol.

In the case of a solid photopolymer, usually a plate is formed by using a polyethylene terephthalate support (a support imparted with antihalation effect is used if needed) and a film having an adhesion preventing layer. In the case of a digital plate referred to as flexo-CTP, a plate is formed by using the aforementioned support and a film having a laser ablation layer. In the case of a liquid photopolymer, the resin is inserted between a support and a film on a commercially available platemaker for a liquid photopolymer, and then subjected to exposure.

Usually, a water-developable photopolymer plate is produced by applying an exposure step (an exposure step with actinic light) and a development step (a washing-out step of the unexposed portions), and then a post-exposure step. In the present invention, it is necessary to bring the photopolymer plate, during or after the exposure step, into contact with a liquid containing a silicone compound and/or a fluorine compound. The silicone compound as referred to herein means an oligomer or polymer the skeleton of which is mainly formed with an alkylsiloxane having an alkyl group typified by a methyl group, and a substance sometimes generally referred to as a silicone oil or the like. The fluorine compound as referred to herein means a compound in which the hydrogen atoms of a hydrocarbon compound are partially or completely substituted with fluorine atoms.

The silicone compound and/or the fluorine compound to be used in the present invention preferably contains a functional group having interaction and/or reactivity with the resin component. More specifically, preferable examples of such a functional group may include functional groups such as a hydroxy group, a carbinol group, an epoxy group, a (meth) acrylate group, a carboxyl group, a carboxylate group, an amino group, an aromatic hydrocarbon group inclusive of a phenyl group, a hydrocarbon group substituted with an aromatic hydrocarbon inclusive of a methylstyryl group, an aromatic hydrocarbon group substituted with a hydroxy group inclusive of a hydroxyphenyl group, an alkoxyl group, a (poly)ether group and a urethane group. A silicone compound and/or a fluorine compound each containing one or more such modifying groups is referred to as a modified silicone compound and/or a modified fluorine compound. In such a modified silicone compound and/or such a modified fluorine compound, the aforementioned one or more modifying groups may be directly bonded to a Si atom (Si atoms) and/or a F atom (F atoms), or may replace one or more hydrogen atoms of a hydrocarbon group bonded to a Si atom and/or a F atom.

The investigation of the present inventors has revealed that even if the photopolymer plate is brought into contact with a silicone compound having no modifying group, for example, a silicone oil the main chain of which is formed with dimethylsiloxane, and/or a fluorine compound having no modifying group, for example, a fluorine oil such as a perfluorocarbon, a hydrofluoroether or a hydrofluorocarbon, no hydrophobilization effect of the surface of the photopolymer plate is attained, or such effect is lost at the initial stage of printing. It can be inferred that this phenomenon is ascribable to the unsuccessful fixation of these compounds to the surface of the photopolymer plate owing to the poor penetration of these compounds into the photopolymer plate, or the poor intermolecular interaction or reactivity with the photopolymer plate.

No constraint is imposed on the method for bringing the photopolymer plate into contact with the modified silicone compound and/or the modified fluorine compound. For example, a treatment liquid is prepared in advance by dissolving such a compound or such compounds in an organic solvent, or an alcohol, preferably an alcohol having 1 to 6 carbon atoms, more preferably ethanol, methanol or isopropyl alcohol. Then, at an appropriate time after the exposure step, the plate can be soaked in the treatment liquid, or the treatment liquid can be coated on the surface of the plate by means of an atomizer, a brush, or the like. When such a treatment liquid is used, the concentration of the silicone compound and/or the fluorine compound in the treatment liquid usually falls within a range from 0.001% by weight to 50% by weight, preferably from 0.01% by weight to 20% by weight, and more preferably from 0.1% by weight to 10% by weight or less. When the concentration is lower than these ranges, no sufficient hydrophobilization effect can be attained. When the concentration exceeds these ranges, the cost for treatment is unpreferably increased without any increased advantageous effect. If needed, the solution containing the silicone compound and/or the fluorine compound may be added with additives such as an antifoaming agent, an antioxidant or an antiseptic agent.

Alternatively, the modified silicone compound and/or the modified fluorine compound is dissolved or dispersed in the developer to be used in the development step of the photopolymer, and the surface of the plate can be brought into contact with the modified silicone compound and/or the modified fluorine compound while the photopolymer plate having been subjected to the exposure step is being developed. This method is a preferable embodiment from the viewpoint that this method can be implemented without further adding a step for bringing the surface of the plate into contact with the modified silicone compound and/or the modified fluorine compound.

As the development method, any methods well known in the art may be adopted. Specifically, examples of such development methods may include a development method in which the unexposed portions are dissolved or scraped away with a brush while the plate is being soaked in a washing liquid; and another development method in which the unexposed portions are dissolved or scraped away with a brush while the plate surface is being sprinkled with a washing liquid by means of a spray. Developers known in the art can be used as the developer for the water-developable photopolymer plate. Such developers usually contain a surfactant as an effective component. Examples of such a surfactant may include an anionic surfactant, an amphoteric surfactant and a nonionic surfactant. These surfactants may be used each alone or as mixtures of two or more thereof.

Examples of the anionic surfactant may include a sulfate salt, a higher alcohol sulfate, a higher alkyl ether sulfate, a sulfated olefin, an alkylbenzene sulfonate, an α-olefin sulfonate, a phosphate and a dithiophosphate. Examples of the amphoteric surfactant may include an amino acid-type amphoteric surfactant and a betaine-type amphoteric surfactant. Examples of the nonionic surfactant may include polyethylene glycol type surfactants such as a higher alcohol ethylene oxide adduct, an alkylphenol ethylene oxide adduct, a fatty acid ethylene oxide adduct, a polyhydric alcohol fatty acid ester ethylene oxide adduct, a higher alkylamine ethylene oxide adduct, a fatty acid amide ethylene oxide adduct and a polypropylene glycol ethylene oxide adduct; and polyhydric alcohol type surfactants such as a glycerol fatty acid ester, a pentaerythritol fatty acid ester, fatty acid esters of sorbitol and sorbitan, alkyl esters of polyhydric alcohols and fatty acid amides of alkanolamines.

It is an effective method to add, in addition to these, a water-miscible organic solvent such as an alkylglycol ether as a penetrating agent, for the purpose of improving the washability of the plate and the penetration of the silicone compound into the plate. The penetrating agent can be selected according to the composition of the resin to be washed. Examples of such a penetrating agent may include mono or polyethylene glycol ether type nonionic penetrating agents such as dibutyl diglycol ether.

As additional components, a PH adjuster, referred to as an alkali builder, may be added; the usable alkali builder may be an organic or inorganic material, and is preferably capable of adjusting the pH to be 9 or more. Examples of such an alkali builder may include sodium hydroxide, sodium carbonate, sodium silicate, sodium metasilicate and sodium succinate.

No particular constraint is imposed on the amounts of the surfactant, penetrating agent and builder in the developer. Usually, the amount of the surfactant, in relation to the weight of the developer, is 1 part by weight to 50 parts by weight, and more preferably 3 parts by weight to 20 parts by weight. The penetrating agent is usually used in a range from 0.2 part by weight or more to 20 parts by weight or less, and more preferably from 0.2 part by weight or more to 10 parts by weight or less, in relation to the weight of the developer. The alkali builder is usually used in a range from 0.1 part by weight to 10 parts by weight, in relation to the weight of the developer. When the amounts of these components are less than the above described ranges, there occur disadvantageous effects such that the time required for development becomes too long. The case in which the amounts of these components exceed the above described ranges is not preferable from the viewpoint of cost.

As described above, the modified silicone compound and/or the modified fluorine compound is dissolved or dispersed in the developer used in the development step of the photopolymer, and the surface of the plate can be brought into contact with the modified silicone compound and/or the modified fluorine compound while the photopolymer plate having been subjected to the exposure step is being developed. When this method is applied, from the viewpoint of the stability of the dissolution or dispersion in the developer, particularly preferable is the modified silicone compound and/or the modified fluorine compound each of which has one or more modifying groups selected from the group consisting of a hydroxy group, a carbinol group, an epoxy group, a (meth)acrylate group, a carboxyl group, a carboxylate group, an amino group and a (poly)ether group. In such a modified silicone compound and/or such a modified fluorine compound, the aforementioned one or more modifying groups may be directly bonded to a Si atom (Si atoms) and/or a F atom (F atoms), or may replace one or more hydrogen atoms of a hydrocarbon group bonded to a Si atom and/or a F atom. The concentration of the modified silicone compound and/or the modified fluorine compound in the developer is preferably 0.01 part by weight to 20 parts by weight, and more preferably 0.1 part by weight to 5 parts by weight. When the concentration is lower than these ranges, no sufficient hydrophobilization effect can be attained. On the other hand, the concentration exceeding these ranges unpreferably increases the cost for treatment without any increased advantageous effect, and sometimes causes adverse effects such that the development rate of the developer is decreased.

When two or more reagents are used in combination, the ratios between the reagents can be optional, but the total amount thereof preferably falls within the above describe ranges.

In the method of the present invention, the effects of the modifying group(s) in the modified silicone compound and/or the modified fluorine compound make it possible to dispose the hydrophobicity-attaining silicone molecules and/or the hydrophobicity-attaining fluorine-containing molecules, each in a high concentration, on the surface of the photopolymer. Conceivably, these molecules are fixed to the surface through the interactions and/or reactions thereof with the components in the photopolymer, and consequently, various problems to occur in printing can be avoided effectively and sustainably. Accordingly, the types and amounts of the modifying groups in the modified silicone compound and/or the modified fluorine compound should be appropriately selected according to the type of the photopolymer to be used.

However, for example, when a solvent based ink exhibiting high penetration into the plate itself is used for printing, sometimes a phenomenon of gradual degradation of the hydrophobilization effect is identified. The present inventors have found that, in such a case, the sustainability of the hydrophobilization effect is improved by irradiation of actinic light after being brought into contact with the modified silicone compound and/or the modified fluorine compound. The actinic light as referred to herein means a light containing at least light of 300 nm or less in wavelength. Actinic light containing light of 300 nm or more in wavelength may be used at the same time if needed. When two or more types of actinic light different in wavelength are irradiated, these types of light may be irradiated at the same time or at separate times. Such irradiation of the plate may be made as an exposure treatment in the air, or may be carried out in a system from which oxygen is eliminated, namely, under a vacuum condition, in an atmosphere of nitrogen gas or another inert gas, in a state in which the plate is immersed in water, or the like.

The reason for the improvement effect of the sustainability of the hydrophobilization effect has not yet been elucidated. Even after the photopolymer plate has been exposed, the photopolymerization initiator remains, and conceivably the irradiation of actinic light to the photopolymer plate generates reactive species in the vicinity of the surface of the plate to cause bonding between the photopolymer component and the modified silicone compound and/or the modified fluorine compound. The irradiation of actinic light may be carried out after the exposure step, and at any time during or after the contact of the modified silicone compound and/or the modified fluorine compound with the photopolymer plate. Usually, the photopolymer plate is produced through the exposure, development and post-exposure steps. Accordingly, the photopolymer plate is brought into contact with the modified silicone compound and/or the modified fluorine compound after the development step and immediately before the post-exposure step, and then the post-exposure and the irradiation with actinic light may be carried out at the same time. For example, there may be adopted a method in which the post-exposure and the irradiation with actinic light are carried out at the same time under the condition such that the modified silicone compound and/or the modified fluorine compound is dispersed in water. Alternatively, the irradiation with actinic light may be carried out as an appropriate step in a manner separated from the post-exposure step. The irradiation should be carried out by appropriately selecting the type of the actinic light source and the irradiation light quantity so as to attain the desired effects properly.

The present inventors have made a further detailed investigation on the advantageous effects of the photopolymer plate produced by bringing the photopolymer plate into contact with a liquid containing the modified silicone compound and/or the modified fluorine compound according to the method of the present invention. Consequently, there has been found a method in which, by measuring the change of the surface property of the photopolymer plate after soaking thereof in a solvent under specified conditions, the advantageous effects desired to be attained in practical printing by the photopolymer plate according to the present invention, in particular, the practical sustainability of the advantageous effects can be identified.

The above mentioned method is a method in which the photopolymer plate is soaked at 20° C. for 4 hours in a mixed solvent of ethyl acetate and isopropyl alcohol, in a weight ratio of 20 to 80, both to be used in the solvent ink; then the plate is further dried at 60° C. for 4 hours or more; and the surface wettability of this photopolymer plate is compared with the surface wettability of the photopolymer plate before the application of the treatment concerned. The measurement method of the surface wettability as referred to herein is such that in an atmosphere at a room temperature of 20° C. and a humidity of 70%, 0.5 ml of a 30 dyne/cm wet tensile test standard solution to be used in the JIS K6768 test method is dropped onto the solid surface of the plate from a height of 20 mm, and the diameter of the solution droplet at 30 seconds after dropping is measured. The diameter of the solution droplet is an average value of the X and Y direction values, and each sample is measured three times, an average value of which is taken as the result. Between before and after the above described treatment using the mixed solvent of ethyl acetate and isopropyl alcohol, the diameter of the indicator tends to increase, namely, the hydrophobicity tends to decrease. However, it has been found that when the variation rate of the diameter is 25% or less, more preferably, 15% or less, a practical sustainability of the advantageous effect in practical printing can be attained. It has also been found that a similar result can be obtained even when this method is applied by using an ink having a high penetration into the plate such as an UV ink, in place of the mixed solvent of ethyl acetate and isopropyl alcohol. Accordingly, the following is also an aspect of the present invention: a water-developable photopolymer plate for letterpress printing for which the rate of the diameter variation of the surface wettability indicator between before and after the treatment, with the 20/80 (weight ratio) ethyl acetate/isopropyl alcohol mixed solvent, of the photopolymer plate having been brought into contact with the modified silicone compound and/or the modified fluorine compound is 25% or less.

Additionally, the present inventors have made a diligent study on the method for scientifically analyzing the surface of the treated photopolymer plate. Consequently, it has been found that particularly when the modified silicone compound is used, the following plate can attain a practical sustainability of the advantageous effect in practical printing: the photopolymer plate for which the relative element concentration of the silicon present on the surface of the photopolymer plate as measured by XPS is 0.1 at % or more, and more preferably 0.5 at % or more, after the treatment with the mixed solvent of ethyl acetate and isopropyl alcohol. Here, it should be noted that "at %" refers to the ratio in terms of the number of atoms on the surface of the photopolymer plate (relative element concentration). The following is also an aspect of the present invention: a water-developable photopolymer plate for which, after the treatment with the mixed solvent of ethyl acetate and isopropyl alcohol, the silicon concentration on the surface of the photopolymer plate having been brought into contact with the modified silicone compound is 0.1 at % or more.

In the resin of the water-developable photopolymer plate for letterpress printing to be used in the present invention, there may be internally added the modified silicone compound and/or the modified fluorine compound to be used, in the method of the present invention, for bringing the photopolymer plate into contact therewith during or after the exposure step for the photopolymer plate. However, such internal addition should be carried out as long as there occur no such adverse effects that the photopolymer plate becomes turbid to cause light scattering when exposed, and consequently, image formation quality is degraded in such a way that there are caused, for example, failure in formation of fine lines and failure in shape of dots. The advantage of such internal addition may include a case where there can be expected an advantageous effect such that the slidability of the photopolymer plate is improved in printing on coarse surface paper or the like to suppress the wear-out of the photopolymer plate, and thus such internal addition can be made if needed. Such a method for bringing the photopolymer plate into contact with the modified silicone compound and/or the modified fluorine compound during or after the exposure step is also an embodiment of the present invention.

Hereinafter, the present invention will be described more specifically with reference to Examples and Comparative Examples, but the present invention is not limited these.

SYNTHESIS EXAMPLE

Synthesis of Hydrophilic Copolymer A

In a pressure reaction vessel equipped with a stirrer and a temperature control jacket, 125 parts by weight of water and 3 parts by weight of an emulsifying agent (the ammonium salt of α-sulfo(1-(nonylphenoxy)methyl-2-(2-propenyloxy)ethoxy-poly(oxy-1,2-ethanediyl)) (trade name: ADEKA REASOAP, manufactured by ASAHI DENKA Co., Ltd.)) were initially placed. The internal temperature was elevated up to a polymerization temperature of 80° C.; then, an oily mixed solution composed of 2 parts by weight of acrylic acid, 5 parts by weight of methacrylic acid, 60 parts by weight of butadiene, 10 parts by weight of styrene, 23 parts by weight of butyl acrylate and t-dodecylmercaptane, and an aqueous solution composed of 28 parts by weight of water, 1.2 parts by weight of sodium peroxodisulfate and 1 part by weight of an emulsifying agent (trade name: ADEKA REASOAP, manufactured by ASAHI DENKA Co., Ltd.) were added thereto over a period of 5 hours and a period of 6 hours, respectively, each at a constant flow rate. The reaction liquid thus obtained was maintained at the same temperature as above for 1 hour to complete the polymerization, and subsequently the reaction liquid was cooled. Then, the produced latex was adjusted to pH7 with sodium hydroxide, thereafter the unreacted substances were removed by steam stripping, and finally, an aqueous solution of a hydrophilic polymer having a the solid content concentration of 40% was obtained, which was dried at 60° C. to yield the hydrophilic copolymer A.

[Evaluation of Ink Fill-In]

The ink fill-in was evaluated by means of an AI-3 type flexographic press (manufactured by IYO KIKAI SEISAKUSYO Co., Ltd.) and a 600LPI (volume: 3.8 cm$^3$/m$^2$) anilox roll. The ink used was an aqueous ink "HW571AQP Process Cyan" (trade name; manufactured by TOYO INK MFG CO., LTD.) that was adjusted to have a viscosity of 15 seconds (Zhan viscometer #4). The used printing substrate was a coated paper (trade name: Pearl Coat; manufactured by Oji Paper Co., Ltd.; basic weight: 106 g/m²). The adopted printing speed was 100 m/min. The anilox pressure was set at a value larger by 0.02 mm than the proper value in order to supply the ink excessively onto the photopolymer plate for the purpose of accelerating the ink fill-in. Also for the same purpose, the printing pressure condition was such that the printing pressure was set at a value larger by 0.15 mm than the proper value so that the deformation of the relief surface could be made larger to accelerate the ink full-in. After a 100 m printing had been made under the above described printing conditions, the anilox roll was separated away from the photopolymer plate. Then, a 10 m printing was made under a condition that the photopolymer plate was away from the anilox roll to remove the excessive ink from the surface of the photopolymer plate. Then, the printing press was halted, and the evaluation was made on the basis of the degree of the ink remaining in the halftone dot portions of the plate. In the image for evaluation, there were 16 halftone dots each of which was designed to have one of the line densities of 100, 133, 150 and 175 LPI and also to have one of the line-drawn area ratios of 1, 2, 3 and 5%. The evaluation was made on the basis of the number of the halftone dots in each of which 30% or more of the image area was found to suffer ink fill-in. In a preferable plate material that hardly suffers ink fill-in, the degree of ink fill-in is expected to be low, with the highest possible evaluation number of 0. On the other hand, in a plate material liable to suffer ink fill-in, the number of the halftone dots suffering ink fill-in is inevitably increased, with the largest possible number of 16.

[Evaluation of the Surface Wettability of the Photopolymer Plate]

The evaluation of the surface wettability of the photopolymer plate was carried out on the basis of the following method. In an atmosphere at a room temperature of 20° C. and a humidity of 70%, 0.5 ml of a 30 dyne/cm wet tensile test mixed solution No. 30.0 (manufactured by Wako Pure Chemical Industries, Ltd.) was dropped from a height of 20 mm onto the solid surface of the plate, and the diameter (unit: mm) of the solution droplet at 30 seconds after dropping was measured. The diameter of the solution droplet was an average value of the X and Y direction values, and each sample was measured three times, an average value of which is taken as the result. On a photopolymer plate liable to suffer ink fill-in, namely, a photopolymer plate having a better wettability, the solution droplet is expanded so as to have a larger diameter; on the contrary, on a plate to hardly suffer ink fill-in, namely, a plate having a worse wettability, the solution droplet is hardly expanded so as to have a smaller diameter; thus, the measurement of the solution droplet diameter enables a comparison of wettability.

[Evaluation of the Sustainability of the Treatment Effect]

The sustainability of the treatment effect as referred to herein refers to the durability in relation to the solvent and the UV ink, as described below, and the evaluation of the surface wettability of the individual photopolymer plates was carried out according to the above described method.

Evaluation Example 1

Treatment Effect Test for Resistance to Solvent (Soaking Test 1)

A prepared photopolymer plate was soaked in the 20/80 (weight ratio) ethyl acetate/isopropyl alcohol mixed solvent at 20° C. for 4 hours, and the surface wettability of the photopolymer plate was evaluated after drying at 60° C. for 4 hours or more.

Evaluation Example 2

Treatment Effect Test for Resistance to UV Ink (Soaking test 2)

A prepared photopolymer plate was soaked in a flexo UV ink "UFL639 indigo" (manufactured by The Incteck Inc.) at 20° C. for 4 hours, and then the ink was washed with isopropyl alcohol. The photopolymer plate was dried at 60° C. for 4 hours, and the surface wettability of the photopolymer plate was evaluated.

[Measurement of the Si Concentration]

The relative element concentration of the silicon present on the surface of a photopolymer plate was measured by means of XPS. The measurement conditions were as described below.

Apparatus: ESCALAB250 Manufactured by Vacuum Generator

Excitation sources: Monochromated AlKα, 15 kV×10 mA

Analysis area: An ellipse of 300 µm×600 µm

Scanning Range

Survey scan: 1,100 to 0 eV (for qualitative analysis)

Narrow scan: Cls, Ols, Si2p, S2p, Nals (for quantitative analysis, chemical state analysis)

Pass Energy

Survey scan: 100 eV

Narrow scan: 20 eV

In the quantitative determination, the relative element concentrations were calculated by using the area intensities of the Cls, Ols, Si2p, S2p and Nals together with the relative sensitivity coefficients, in terms of the unit of at %. The applied relative sensitivity coefficients were as follows:

Cls: 1.00; Ols: 2.72; Si2p: 0.93; S2p: 1.67; Nals: 8.52

[Evaluation in Practical Printing]

The used ink was a solvent-based ink FB King (indigo, manufactured by TOYO INK MFG CO., LTD.), and the used printing substrate was a low density polyethylene. A printing of 50,000 sheets was carried out at a speed of 200 m/min, by using an anilox roll of an 800 lpi (cell volume: 3.8 cm³/m²) and a cushion tape of 3M1020 (manufactured by Sumitomo 3M Co., Ltd.). The photopolymer plates used for evaluation were designed with solid printed portions, independent dots and independent lines, void lines, and segments each having one of the screen rulings of 100, 133, 150 and 175 lpi, and also having one of the dot area ratio of 1, 2, 3 and 5%. The evaluation "C" refers to the case in which the halftone dot portion suffers ink fill-in before completion of printing to lead to a state that printing is needed to be halted; the evaluation "B" refers to the case in which printing is completed, but the density in the solid printed portion decreases or the halftone dot portion becomes thick; and the evaluation "A" refers to the case in which printing is completed, and the density of the solid printed portion does not decrease and the halftone dot portion does not become thick.

Example 1

A photopolymer composition was obtained by homogeneously kneading, with a kneader at 130° C., 30 parts by weight of the hydrophilic copolymer A described in the above synthesis example, 25 parts by weight of a styrene-butadiene-styrene block copolymer (KRATON KX405, Shell Chemical), 30 parts by weight of a liquid polybutadiene (LIR305, KURARAY Co., Ltd.), 2.5 parts by weight of hexamethylene dimethacrylate, 8 parts by weight of 2-butyl, 2-ethylpropanediol diacrylate, 2 parts by weight of 2,2-dimethoxy-2-phenylacetophenone and 0.3 part by weight of 2,6-di-t-butyl-p-cresol.

The composition was formed into a 1.14 mm thick photopolymer plate by means of a hot press machine at 120° C., by using a polyethylene terephthalate film support having a urethane adhesive layer and a film having an adhesion preventing layer composed of polyvinyl alcohol and cellulose. This photopolymer plate was found to have almost no turbidity, and maintained the transparency thereof. The photopolymer plate was subjected to a 600 mJ whole area exposure from the support side by means of an exposure apparatus JET-A2-HSS (manufactured by Nihon Denshi Seiki Co., Ltd.), then the film on the opposite side was peeled off, and then a 5000 mJ image exposure was carried out through a negative film. Next, the unexposed portion was washed out by means of a flat washer (manufactured by Robo Denshi) with an aqueous developer composed of 5 parts by weight of LEOCOL SC-80 (manufactured by LION Corporation), as a surfactant, that is composed of 5-mole ethylene oxide adducts of secondary alcohols having 12 to 14 carbon atoms, 1 part by weight of dibutyldiethylene glycol as a penetrating agent, and 0.4 part by weight of sodium carbonate. The photopolymer plate was dried at 60° C. for 15 minutes, and was subsequently subjected to the post-exposure by means of a chemical lamp and a sterilization lamp. The photopolymer plate was soaked for 1 minute in a 1/9 (weight ratio) ethanol/water mixed solution containing 0.1 part by weight of a methacryl-modified silicone compound X-22-174DX (manufactured by Shin-Etsu Chemical Co., Ltd.), and then dried at 60° C. for 10 minutes to yield a desired photopolymer plate. The evaluation results concerned are shown in Table 1.

Example 2

An objective photopolymer plate was obtained in the same manner as in Example 1 except that a methylstyryl-modified silicone compound KF-410 (manufactured by Shin-Etsu Chemical Co., Ltd.) was used in place of the methacryl-modified silicone compound X-22-174DX. The evaluation results concerned are shown in Table 1.

Example 3

A photopolymer plate obtained in the same manner as in Example 2 was used, and the photopolymer plate was further subjected to an actinic light irradiation by means of the chemical lamp and the sterilization lamp to yield a desired photopolymer plate. The evaluation results concerned are shown in Table 1.

Comparative Example 1

The photopolymer described in Example 1 was processed through the forming, exposure and washing out steps under the same conditions as in Example 1, to yield a photopolymer plate. The photopolymer plate was dried at 60° C. for 15 minutes, and then subjected to the post-exposure by means of the chemical lamp and the sterilization lamp with the same exposure light quantity to yield a predetermined photopolymer plate. The evaluation results concerned are shown in Table 1.

Example 4

The photopolymer described in Example 1 was processed through the forming, exposure and washing out steps under the same conditions as in Example 1, to yield a photopolymer plate. The photopolymer plate was dried at 60° C. for 15 minutes, then soaked for 1 minute in a 1% by weight ethanol solution of the methacryl-modified silicone compound X-22-164A (trade name, manufactured by Shin-Etsu Chemical Co., Ltd.), and then further dried for 5 minutes. The photopolymer plate was subjected to the post-exposure by means of the chemical lamp and the sterilization lamp to yield a desired photopolymer plate. The evaluation results concerned are shown in Table 1.

Example 5

An objective photopolymer plate was obtained in the same manner as in Example 4 except that a phenol-modified silicone compound X-22-1621 (manufactured by Shin-Etsu Chemical Co., Ltd.) was used in place of X-22-164A. The evaluation results concerned are shown in Table 1.

Example 6

An objective photopolymer plate was obtained in the same manner as in Example 4 except that an epoxy-modified silicone compound X-22-163A (manufactured by Shin-Etsu Chemical Co., Ltd.) was used in place of X-22-164A. The evaluation results concerned are shown in Table 1.

Example 7

The photopolymer described in Example 1 was processed through the forming, exposure and washing out steps under the same conditions as in Example 1, to yield a photopolymer plate. The photopolymer plate was dried at 60° C. for 15 minutes. Then, Asahi Guard AG5850 (manufactured by ASAHI GLASS Co., Ltd.; a mineral spirit dilution composed of polyethylene fluoride and a perfluoroalkyl group-containing acrylic copolymer) was sprayed onto the photopolymer plate, then the photopolymer plate was dried at 60° C. for 1 hour, and subjected to the post-exposure by means of the chemical lamp and the sterilization lamp to yield an objective photopolymer plate. The evaluation results concerned are shown in Table 1.

Example 8

The photopolymer described in Example 1 was processed through the forming, exposure and washing out steps under the same conditions as in Example 1, to yield a photopolymer plate. The photopolymer plate was dried at 60° C. for 15 minutes. Then, under the condition that the photopolymer plate was soaked in the 1/9 (weight ratio) ethanol/water mixed solution in which 0.1 part by weight of a higher fatty acid ester-modified silicone compound X-22-715 (trade name, manufactured by Shin-Etsu Chemical Co., Ltd.) was dispersed, the photopolymer plate was subjected to the post-exposure by means of the chemical lamp and the sterilization lamp, to yield an objective photopolymer plate. The evaluation results concerned are shown in Table 1.

Example 9

An objective photopolymer plate was obtained in the same manner as in Example 8 except that a carbinol-modified silicone compound X-22-160AS (trade name, manufactured by Shin-Etsu Chemical Co., Ltd.) was used in place of X-22-715. The evaluation results concerned are shown in Table 1.

Comparative Example 2

The photopolymer described in Example 1 was processed through the forming, exposure and washing out steps under the same conditions as in Example 1, to yield a photopolymer plate. The photopolymer plate was dried at 60° C. for 15 minutes. Then the photopolymer plate was soaked for 1 minute in a 1% by weight ethanol solution of a dimethylsilicone oil having no functional groups other than methyl, and then, further dried for 5 minutes. The photopolymer plate was subjected to the post-exposure by means of the chemical lamp and the sterilization lamp, to yield an objective photopolymer plate. The evaluation results concerned are shown in Table 1.

Example 10

The photopolymer described in Example 1 was processed through the forming and exposure steps under the same conditions as in Example 1. Thereafter, the unexposed portion was washed out by means of the flat washer (manufactured by Robo Denshi) with an aqueous developer composed of 5 parts by weight of LEOCOL SC-80 (manufactured by LION Corporation), as a surfactant, that is composed of 5-mole ethylene oxide adducts of secondary alcohols having 12 to 14 carbon atoms, 1 part by weight of dibutyldiethylene glycol as a penetrating agent, 0.2 part by weight of a polyethylene glycol polypropylene glycol-modified silicone oil TSF4452 (manufactured by GE Toshiba Silicone Co., Ltd.) and 0.4 part by weight of sodium carbonate. The photopolymer plate was dried at 60° C. for 30 minutes, and was subjected to the post-exposure by means of the chemical lamp and the sterilization lamp to yield a desired photopolymer plate. The evaluation results concerned are shown in Table 1.

Example 11

The photopolymer described in Example 1 was processed through the forming and exposure steps under the same conditions as in Example 1. Thereafter, an objective photopolymer plate was obtained in the same manner as in Example 10 except that the silicone compound to be added to the aqueous developer was replaced with the carbinol-modified silicone compound X-22-160AS (manufactured by Shin-Etsu Chemical Co., Ltd.). The evaluation results concerned are shown in Table 1.

Example 12

The photopolymer described in Example 1 was processed through the forming and exposure steps under the same conditions as in Example 1. Thereafter, an objective photopolymer plate was obtained in the same manner as in Example 10 except that the silicone compound to be added to the aqueous developer was replaced with the methacryl-modified silicone compound X-22-164A (manufactured by Shin-Etsu Chemical Co., Ltd.). The evaluation results concerned are shown in Table 1.

Example 13

The photopolymer described in Example 1 was processed through the forming and exposure steps under the same conditions as in Example 1. Thereafter, an objective photopolymer plate was obtained in the same manner as in Example 10 except that the silicone compound to be added to the aqueous developer was replaced with a carboxyl-modified silicone compound X-22-162C (manufactured by Shin-Etsu Chemical Co., Ltd.). The evaluation results concerned are shown in Table 1.

Example 14

The photopolymer described in Example 1 was processed through the forming and exposure steps under the same conditions as in Example 1. Thereafter, an objective photopolymer plate was obtained in the same manner as in Example 10 except that the silicone compound to be added to the aqueous developer was replaced with an amino group-modified silicone compound KF-393 (manufactured by Shin-Etsu Chemical Co., Ltd.). The evaluation results concerned are shown in Table 1.

TABLE 1

| Example | Hydrophobic substance | Treatment step | Actinic light irradiation after treatment | Evaluation result — Sustainability of treatment effect | Si concentration (at %) |
|---|---|---|---|---|---|
| Example 1 | Methacryl-modified silicone | After post-exposure | None | | |
| Example 2 | Methylstyryl-modified silicone | After post-exposure | None | | |
| Example 3 | Methylstyryl-modified silicone | After post-exposure | Applied | | |
| Comparative Example 1 | None | — | — | | |
| Example 4 | Methacryl-modified silicone | Before post-exposure | Applied | | |
| Example 5 | Phenol-modified silicone | Before post-exposure | Applied | | |
| Example 6 | Epoxy-modified silicone | Before post-exposure | Applied | | |
| Example 7 | Acryl-modified fluorine compound | Before post-exposure | Applied | | |
| Example 8 | Ester-modified silicone | During post-exposure | Applied | | |
| Example 9 | Carbinol-modified silicone | During post-exposure | Applied | | |
| Comparative Example 2 | Dimethylsilicone oil | Before post-exposure | Applied | | |
| Example 10 | Polyether-modified silicone | During washing | Applied | | |
| Example 11 | Carbinol-modified silicone | During washing | Applied | | |
| Example 12 | Methacryl-modified silicone | During washing | Applied | | |
| Example 13 | Carboxyl-modified silicone | During washing | Applied | | |
| Example 14 | Amino-modified silicone | During washing | Applied | | |

TABLE 1-continued

| Example | Ink fill-in | Surface wettability (mm) | Soaking test 1 (mm) | soaking test 2 (mm) | measurement (after soaking test 1) | Evaluation in particle printing |
|---|---|---|---|---|---|---|
| Example 1 | 0 | 15 | 15 | 15 | 2.7 | B |
| Example 2 | 0 | 15 | 17 | 18 | 1.9 | B |
| Example 3 | 0 | 15 | 15 | 15 | 2.5 | A |
| Comparative Example 1 | 13 | 25 | Not evaluated | Not evaluated | — | C |
| Example 4 | 0 | 13 | 13 | 13 | 2.5 | A |
| Example 5 | 0 | 16 | 16 | Not evaluated | 1.9 | Not applied |
| Example 6 | 0 | 14 | 14 | Not evaluated | 2.2 | A |
| Example 7 | 0 | 17 | Not evaluated | Not evaluated | — | A |
| Example 8 | 0 | 15 | 16 | Not evaluated | Not measured | A |
| Example 9 | 0 | 15 | 15 | 15 | 2.0 | A |
| Comparative Example 2 | 11 | 18 | 23 | Not evaluated | 0.01 | C |
| Example 10 | 0 | 13 | 13 | Not evaluated | Not measured | A |
| Example 11 | 0 | 13 | 13 | 13 | 2.3 | A |
| Example 12 | 0 | 15 | 15 | Not evaluated | Not measured | A |
| Example 13 | 0 | 16 | 16 | Not evaluated | Not measured | Not applied |
| Example 14 | 0 | 16 | 16 | Not evaluated | Not measured | Not applied |

Comparative Referential Example 1

A photopolymer composition was obtained by homogeneously kneading, with the kneader at 130° C., 30 parts by weight of the hydrophilic copolymer A described in the referential example, 25 parts by weight of a styrene-butadiene-styrene block copolymer (trade name: KRATON KX405, Shell Chemical), 30 parts by weight of a liquid polybutadiene (trade name: LIR305, KURARAY Co., Ltd.), 2.5 parts of hexamethylene dimethacrylate, 8 parts by weight of 2-butyl, 2-ethylpropanediol diacrylate, 2 parts by weight of 2,2-dimethoxy-2-phenylacetophenone, 0.3 part by weight of 2,6-di-t-butyl-p-cresol and 0.5 part by weight of the higher fatty acid ester-modified silicone compound X-22-715 (manufactured by Shin-Etsu Chemical Co., Ltd.).

The composition was formed into a 1.14 mm thick photopolymer plate by means of a hot press machine at 120° C., by using a polyethylene terephthalate film support having a urethane adhesive layer and a film having an adhesion preventing layer composed of polyvinyl alcohol and cellulose. This photopolymer plate was found to have almost no turbidity, and maintained the transparency thereof. The photopolymer plate was subjected to a 600 mJ whole area exposure from the support side by means of an exposure apparatus JET-A2-HSS (manufactured by Nihon Denshi Seiki Co., Ltd.), then the film on the opposite side was peeled off, and then a 5000 mJ image exposure was carried out through a negative film. Next, the unexposed portion was washed out by means of the flat washer (manufactured by Robo Denshi) with an aqueous developer composed of 5 parts by weight of LEOCOL SC-80 (manufactured by LION Corporation), as a surfactant, that is composed of 5-mole ethylene oxide adducts of secondary alcohols having 12 to 14 carbon atoms, 1 part by weight of dibutyldiethylene glycol as a penetrating agent, and 0.4 part by weight of sodium carbonate. The photopolymer plate was dried at 60° C. for 15 minutes, and was subsequently subjected to the post-exposure by means of a chemical lamp and a sterilization lamp to yield an objective photopolymer plate. The ink fill-in evaluation of this photopolymer plate revealed that the ink fill-in was identified in 6 halftone dots, and the result of the practical printing evaluation was graded as "C."

Comparative Referential Example 2

The above described composition was formed into a 1.14 mm thick photopolymer plate in the same manner as in Comparative Referential Example 1 except that the amount of the higher fatty acid ester-modified silicone compound X-22-715 was altered to 2.0 parts by weight. This photopolymer plate was found to suffer turbidity; the photopolymer plate, which was subjected to the exposure, washing and post-exposure steps in the same manner as in Comparative Referential Example 1, gave such a significantly degraded image reproducibility that void lines were blurred and halftone dots became broad in shape.

Example 15

A photopolymer plate obtained by forming so as to have a thickness of 1.14 mm in the same manner as in Comparative Referential Example 1 was used. The photopolymer plate was subjected to exposure, washing and post-exposure in the same manner as in Example 12 to yield an objective photopolymer plate. The ink fill-in evaluation revealed no ink fill-in at all, and the practical printing evaluation gave the grade "A." It was found that the method of the present invention improved the performances of the photopolymer plate for which a slight amount of silicone had been internally added into the photopolymer and which had suffered slight ink fill-in and had been given no satisfactory result in the practical printing evaluation.

Example 16

A commercially available water-developable solid plate AQS (manufactured by E.I du Pont de Nemours and Company) was used as a photopolymer plate. An objective photopolymer plate was obtained in the same manner as in Example 4 except that the exposure was made by selecting the exposure light quantity for forming the image. With respect to the ink fill-in evaluation, this photopolymer plate was compared with another photopolymer plate obtained from the same AQS by subjecting the AQS to the exposure, washing and post-exposure in the same manner as in Comparative Example 1. Consequently, it was found that the treatment with a modified silicone prevented the generation of ink fill-in.

Example 17

A commercially available water-developable solid plate Cosmolight (manufactured by TOYOBO LTD.) was used as a photopolymer plate. An objective photopolymer plate was obtained in the same manner as in Example 4 except that the exposure was made by selecting the exposure light quantity for forming the image. With respect to the ink fill-in evaluation, this photopolymer plate was compared with another photopolymer plate obtained from the same Cosmolight by subjecting the Cosmolight to the exposure, washing and post-exposure in the same manner as in Comparative Example 1. Consequently, it was found that the treatment with the modified silicone prevented the generation of ink fill-in.

Example 18

A liquid photopolymer APR, F-320 (manufactured by Asahi Kasei Chemicals Corporation) was sandwiched between a cover film CF-82 (manufactured by Asahi Kasei Chemicals Corporation) and a base film BF-4B8 (manufactured by Asahi Kasei Chemicals Corporation) on an exposure apparatus ALF-213E (manufactured by Asahi Kasei Chemicals Corporation) so as to have a thickness of 2.84 mm, and the photopolymer plate thus obtained was subjected to a 150 mJ whole area exposure from the base film side. Thereafter, the photopolymer plate was subjected to a 500 mJ image exposure through a negative film, containing a solid image and halftone dots of 30, 45 and 65 lpi, disposed outside the cover film. Then, the cover film was removed and the unexposed resin was collected. Thereafter, the photopolymer plate was washed by means of a washing machine AL-400W (manufactured by Asahi Kasei Chemicals Corporation) with a washing liquid W-10 (manufactured by Asahi Kasei Chemicals Corporation). The photopolymer plate thus obtained was subjected to post-exposure in water by means of a post-exposure machine ALF-200 UP by using a chemical lamp and a sterilization lamp. Thereafter, the photopolymer plate was soaked for 10 minutes in a 1% by weight ethanol solution of an epoxy group-modified silicone compound X-22-173DX (manufactured by Shin-Etsu Chemical Co., Ltd.), and then again subjected to exposure in water by means of the post-exposure machine ALF-200UP by using the chemical lamp and the sterilization lamp, to yield an objective photopolymer plate. From a comparison of the ink fill-in between the photopolymer plate before the treatment with the modified silicone compound and the plate subjected to the treatment with the modified silicone compound and the subsequent exposure, it was found that the treatment with the modified silicone compound prevented the generation of ink fill-in.

INDUSTRIAL APPLICABILITY

The present invention improves the printing performances of the water-developable photopolymer plate for letterpress printing, and can be applied as a plate making method that alleviates the problems in printing.

The invention claimed is:

1. A method for producing a water-developable photopolymer plate for letterpress printing, wherein the plate is made from a photopolymer, comprising an exposure step, a development step and a post-exposure step, wherein the method further comprises a contact step during or after the exposure step and an irradiation step with actinic light during or after said contact step, wherein said contact step brings the photopolymer plate into contact with a liquid comprising a silicone compound modified with one or more reactive functional groups selected from a hydroxy group, a carbinol group, an epoxy group, a (meth)acrylate group, a carboxyl group, a carboxylate group, and/or an amino group, wherein the photopolymer comprises:
   a resin in which a polar group-containing polymer and a hydrophobic polymer are mixed and dispersed;
   an ethylenically unsaturated compound; and
   a photopolymerization initiator.

2. The method according to claim 1, wherein an irradiation with actinic light is carried out after the photopolymer plate is brought into contact with the liquid comprising the silicone compound.

3. The method according to claim 2, wherein the photopolymer plate is brought into contact with the liquid comprising the silicone compound after the development step and immediately before the post-exposure step.

4. The method according to claim 2, wherein development is carried out by using a developer comprising the silicone compound.

5. The method according to claim 1, wherein the post-exposure step is carried out while the photopolymer plate is being brought into contact with the liquid comprising the silicone compound.

6. The method according to claim 1, wherein the liquid comprising the silicone compound is a developer.

7. The method according to claim 1, wherein the irradiation step with actinic light is carried out during the post-exposure step.

8. The method according to claim 1, wherein the contact step and the irradiation step with actinic light are carried out simultaneously.

9. The method according to claim 1, wherein the contact step is carried out during the development step.

* * * * *